United States Patent
Tzu et al.

(10) Patent No.: US 6,872,507 B2
(45) Date of Patent: Mar. 29, 2005

(54) RADIATION CORRECTION METHOD FOR ELECTRON BEAM LITHOGRAPHY

(75) Inventors: San-De Tzu, Taipei (TW); Ching Shiun Chiu, Hsinchu (TW); Wei-Zen Chou, Jungle (TW); Chia Fang Wu, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 166 days.

(21) Appl. No.: 10/286,231

(22) Filed: Nov. 1, 2002

(65) Prior Publication Data

US 2004/0086786 A1 May 6, 2004

(51) Int. Cl.[7] .................................................. G03C 5/00
(52) U.S. Cl. ........................ 430/296; 430/394; 430/942
(58) Field of Search .............................. 430/296, 394, 430/942

(56) References Cited

U.S. PATENT DOCUMENTS

| | | | |
|---|---|---|---|
| 4,463,265 A | * | 7/1984 | Owen et al. ............. 250/492.2 |
| 5,451,487 A | | 9/1995 | Abe et al. ................... 430/296 |
| 5,510,214 A | | 4/1996 | Pan et al. ....................... 430/5 |
| 5,582,938 A | | 12/1996 | Ham ............................... 430/5 |
| 5,847,959 A | | 12/1998 | Veneklasen et al. ... 364/468.28 |
| 5,885,748 A | | 3/1999 | Ohnuma ..................... 430/296 |
| 6,194,103 B1 | * | 2/2001 | Tzu et al. ....................... 430/5 |

* cited by examiner

Primary Examiner—Christopher G. Young
(74) Attorney, Agent, or Firm—Thomas, Kayden, Horstemeyer & Risley

(57) ABSTRACT

A method for forming a patterned microelectronics layer employing electron beam lithography in a sensitive material upon a substrate with optimal correction for proximity effects resulting from electron back scattering into the resist material. There is provided a substrate having formed thereon a layer of resist material sensitive to electron beam exposure. There is then exposed the sensitive layer to a vector scan shaped electron beam to write a primary pattern with dose correction of the beam dose for proximity effects due to electron scattering at each point in the primary pattern. There is then written a secondary pattern which is a negative reversed image of the primary pattern in a secondary exposure employing a vector scan shaped focused electron beam at an exposure dose substantially below the primary beam dose, there being provided a gap between the primary pattern and the secondary pattern. There is then developed the primary pattern in the sensitive resist layer to form the final corrected pattern on the substrate. The patterned layer of resist material may be employed directly on the substrate on which it is formed, or alternatively the patterned resist layer may be employed formed over an opaque layer upon the transparent substrate and subsequently the pattern etched into the opaque layer to form a photomask.

12 Claims, 5 Drawing Sheets

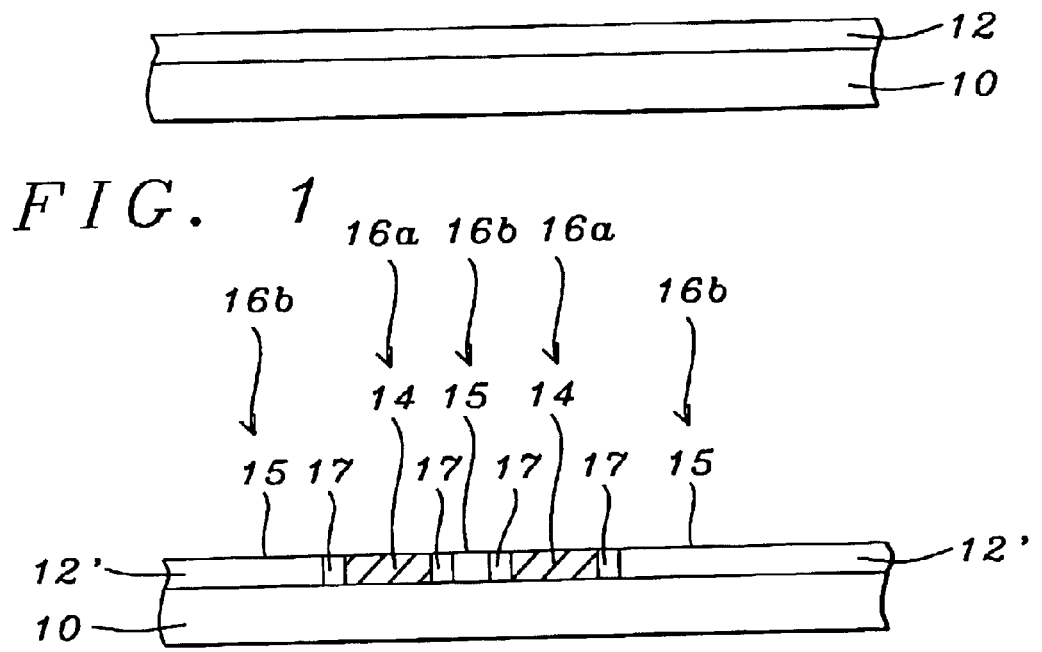
FIG. 1
FIG. 2
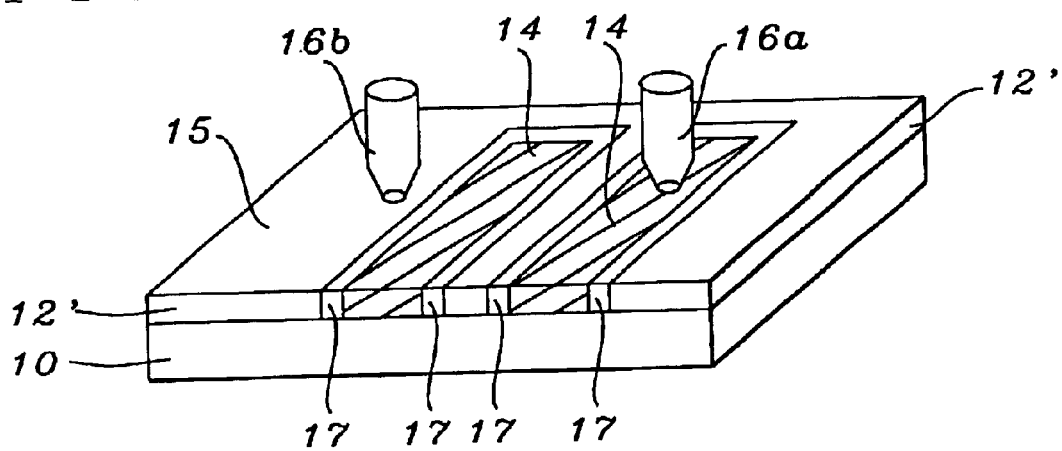
FIG. 3
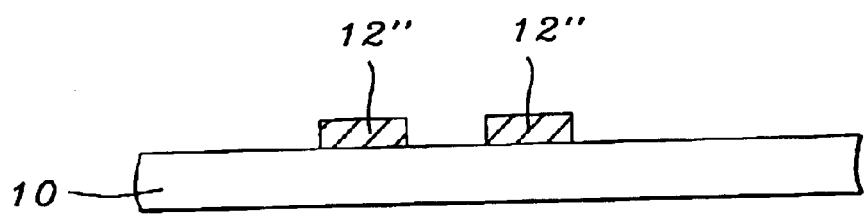
FIG. 4

RADIATION CORRECTION METHOD FOR ELECTRON BEAM LITHOGRAPHY

BACKGROUND OF THE INVENTION

1. Field of the Invention

The invention relates to the field of manufacture of microelectronics devices employing patterned etch mask resist layers to form patterns. More particularly the invention relates to the employment of electron beam microlithography fabrication methods to form patterned etch resist mask layers and patterned photomasks.

2. Description of the Related Art

Microelectronics fabrications consist of multiple layers of microelectronics materials formed on a substrate. Many of the microelectronics layers are patterned and must be not only accurate and precise in themselves, but must also be registered with great precision to other patterned layers. These objectives are met by employing photolithographic methods in which the desired patterns are first formed as patterned stencil photomasks with opaque and transparent regions. This pattern is then transferred to a photosensitive layer or photoresist by illumination through the patterned photomask, causing a chemical difference in the illuminated and non-illuminated regions. This difference may be exploited by subsequent chemical development of the pattern image in the photoresist layer which is then employed as a patterned photomask layer for fabrication purposes such as, for example, subtractive etching of an underlying material layer to transfer the pattern.

In order to fabricate photomasks for pattern formation in microelectronics fabrication, it is necessary to start with a master image of the desired pattern. In the early stages of development of microelectronics fabrication technology, such master image patterns were generally enlarged versions of the pattern which were then reduced by photographic methods to the final dimensions on the working photomask. This process was tedious and costly, and has been largely replaced by the use of direct exposure of the photomask opaque blank substrate, coated with a layer of sensitive resist material, to the desired pattern. The exposure is normally done with a directed electron beam to obtain the required precision and fine dimensions required. The energy absorbed from the directed electron beam is integrated by the resist material layer into a chemical change which can be exploited to develop the exposed pattern in the resist layer such that the pattern can then be transferred into the underlying opaque substrate layer.

Because the resist layer integrates all energy to which it is exposed, not only is the directly incident electron beam energy stored in the resist, but also any stray electrons from scattering processes elsewhere are capable of registering their effect on the resist. Thus the total energy absorbed by a given exposed region is not only a function of the electron energy dose intentionally delivered by design to that region, but also a function of the electrons absorbed from those delivered nearby and scattered back into the intended exposed region. This so-called "proximity effect" on the actual energy dose absorbed by the resist layer in a given region from the design nominal electron dose delivered to a region and that absorbed from electrons from nearby regions due to scattering is a significant effect on the accuracy with which the developed resist image follows the designed pattern of electron beam energy delivery. The proximity effect may be divided into "mutual proximity" effects from nearby electrons scattered sideways from adjacent pattern elements, and "self-proximity" effects from electrons delivered directly to the desired region which after passage through the resist layer and into the substrate are fortuitously scattered backwards at lower energy.

The correction for proximity effects to improve on the accuracy of electron beam exposed resist patterns is generally accomplished by adjustment of the actual electron energy dose delivered for exposure after taking into account the pattern of nearby exposures and estimating the degree of extra electron energy from scattering, and reducing the delivered dose accordingly. Although effective for many purposes, this dose correction method is not without problems, particularly with respect to being costly and time-consuming.

Another method for improving the accuracy of electron beam exposure of resist layers is known as the "ghost" correction method. In this method, the desired pattern of exposed resist is written in two steps: a first pattern which is the desired pattern written at a fixed dose, and a second pattern which is a negative reversal of the first pattern and written at a lower dose, generally with a defocused electron beam. The method relies on the total dose at the edge of a first pattern feature to have its slightly lower actual dose increased by the background exposure dose of the second pattern exposure to provide the desired pattern exposure dose for proper pattern image development.

Although the method of dose correction of the written pattern or the "ghost" correction method are in general satisfactory for general use in electron beam lithography, neither method is entirely without problems. Densely populated patterns require inordinately long and costly calculation of incremental dose correction adjustments for each pattern element in the dose correction method. For small features and/or sparsely populated designs, the time required for the second exposure of the "ghost" correction method is time consuming and the defocused beam may cause resolution problems.

It is thus towards the goal of forming patterned resist mask layers and/or photomasks by irradiation of sensitive material layers employing electron beam lithography with correction of proximity effects to improve pattern accuracy that the present invention is generally directed.

Various methods have been disclosed for the formation of mask layers and masks by electron beam pattern generation with correction for proximity effects.

For example, Abe et al., in U.S. Pat. No. 5,451,487, disclose a method for correction of electron beam exposure of patterns based on the "ghost" method which greatly decreases the time for correction. The method calculates a dose required for a representative figure combining a number of smaller pattern features, and then supplies the required dose employing a defocused beam to write the inverted pattern.

Further, Pan et al., in U.S. Pat. No. 5,510,214, disclose a method for forming a double destruction phase shift mask (PSM) which eliminates the spurious "ghost" line in the mask image which may occur in conventional phase shift masks. The method combines transparent phase shifting regions with attenuating phase shifting regions to form interference patterns which reduce the light intensity transmitted to nearly zero in the pattern elements of the mask.

Still further, Ham, in U.S. Pat. No. 5,582,938, discloses a method for forming a phase shift mask which prevents the formation of a "ghost" image due to interference and diffraction of light with a phase angle of 0 and 180 degrees. The method employs a photoresist layer.

Yet still further, Veneklasen et al., in U.S. Pat. No. 5,847,959, disclose a method for correcting an electron beam pattern for proximity effects due to electron scattering, heating and thermal expansion effects. The method employs a raster scanning electron beam in which calculated corrections for the various proximity effects are applied to the delivered dose as correction factors.

Finally, Ohnuma, in U.S. Pat. No. 5,885,748, discloses a method for correcting photomask patterns for proximity effects due to electron beam scattering or light exposure employing the photomask. The method utilizes correction of the pattern by forming a mesh and determining if another portion of the pattern is close enough to cause a proximity effect. If so, the dose is corrected to result in a final exposure pattern which is close to the design pattern.

Desirable in the art of microelectronics fabrication are further methods for forming patterned resist mask layers, bipolar photomasks and phase shift photomasks with electron beam exposure of patterns with correction for proximity effects.

It is towards these goals that the present invention is generally and more specifically directed.

SUMMARY OF THE INVENTION

It is a first object of the present invention to provide a method for fabrication of patterned microelectronics layers employing electron beam exposure of sensitive material layers with optimal correction for proximity effects due to scattered electrons in said sensitive material layer.

It is a second objective of the present invention to provide a method in accord with the first object of the present invention where there is formed a patterned photomask employing electron beam lithography of sensitive resist materials with optimal correction of the pattern for proximity effects due to electron scattering back into the sensitive resist material.

It is a third object of the present invention to provide a method in accord with the first object of the present invention and the second object of the present invention, where an optimal pattern correction for proximity effects is achieved with reduced computational effort compared to conventional electron beam lithographic correction methods.

It is a fourth object of the present invention to provide a method in accord with the first object of the present invention, the second object of the present invention and the third object of the present invention, where the method is readily commercially implemented.

In accord with the objects of the present invention, there is provided a method for forming a patterned microelectronics layer employing electron beam exposure of a sensitive layer on a substrate with optimal correction of the pattern for proximity effects in the sensitive material layer due to scattered electrons. To practice the invention, there is provided a substrate having formed thereupon a layer of material sensitive to electron beam exposure. There is then exposed the sensitive layer to a vector scan shaped electron beam to write a primary pattern with dose correction of the beam for proximity effects of the primary pattern at each point in the pattern. There is then written a secondary pattern which is a negative reverse image of the primary pattern in a second exposure employing a vector scan shaped focused electron beam at an exposure dose substantially equivalent to the maximum exposure dose employed in the primary pattern exposure, there being provided a gap between the boundaries of the first pattern and the second pattern. There is then developed the primary pattern written in the sensitive layer to form the final corrected pattern. The patterned layer of resist material may be formed directly on a substrate within which the microelectronics device is fabricated, or alternately the patterned resist layer may be formed over an opaque layer on a blank photomask substrate for further processing by subtractive etching into a patterned photomask.

The present invention provides a method for forming a patterned resist layer employing electron beam writing of a pattern in the resist layer with correction for proximity effects due to electron scattering employing dose correction and ghost pattern correction methods. The method is suitable for formation of a patterned resist layer upon a substrate for employment in microelectronics fabrication processes such as subtractive etching, deposition, etc. The substrate may be formed of material chosen from the group consisting of microelectronics conductor materials, microelectronics semiconductor materials and microelectronics dielectric materials. The substrate may be employed within a microelectronics fabrication chosen from the group including but not limited to microelectronics integrated circuit fabrications, charge coupled device microelectronics fabrications, solar cell microelectronics fabrications, optoelectronics display microelectronics fabrications, radiation emitting microelectronics fabrications, ceramic substrate microelectronics fabrications and flat panel display microelectronics fabrications. Alternatively, the method may be applied equally well to the formation of a resist layer upon a blank photomask substrate for subsequent etching of a patterned photomask. Both bipolar photomasks and phase shift photomasks may be fabricated by the present invention.

The present invention employs methods and materials for pattern generation and fabrication as are known in the art of microelectronics fabrication, but in a novel order and arrangement. The method of the invention is therefore readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form a material part of this disclosure, wherein:

FIG. 1, FIG. 2, FIG. 3, and FIG. 4 show a series of schematic diagrams which illustrate the formation of a patterned resist layer upon a substrate employing electron beam lithography with optimal proximity effect pattern correction in accord with a general embodiment of the present invention which is a first preferred embodiment of the present invention.

FIG. 9 and FIG. 10 illustrate both primary first patterns and secondary negative "ghost" patterns for each type of feature.

DESCRIPTION OF THE PREFERRED EMBODIMENTS

Figure 5:
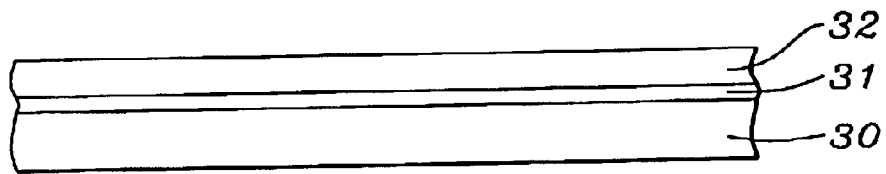
FIG. 5, FIG. 6, FIG. 7 and FIG. 8 show a series of schematic cross-sectional diagrams illustrating the formation of a patterned photomask employing electron beam lithography of a sensitive resist material with optimal proximity effect correction for electron back scattering into the resist material in accord with a more specific embodiment of the present invention which is a second preferred embodiment of the present invention.

The present invention provides a method for forming a patterned resist layer for microelectronics fabrication wherein the pattern is formed employing vector scan electron beam exposure with optimal proximity effect correction by dose correction and "ghost" image inversion correction with a focused beam.

First Preferred Embodiment

FIG. 1 to FIG. 5 are a series of schematic diagrams illustrating the results of forming upon a substrate a patterned resist layer by vector scan electron beam exposure with optimal proximity effect exposure dose correction and "ghost" pattern correction with a shaped focused beam FIGS. 1–2 and FIGS. 4–5 are schematic cross-sectional diagrams illustrating progressive stages in the fabrication of the patterned resist layer; FIG. 3 is a schematic plan view of the patterned resist layer corresponding to FIG. 2. FIG. 1 is a schematic cross-sectional diagram of the substrate at an early a stage in its fabrication in accord with a first preferred embodiment of the present invention.

Shown in FIG. 1 is a substrate 10 having formed thereupon a sensitive resist layer 12.

With respect to the substrate 10 shown in FIG. 1, the substrate 10 is formed employing material selected from the group consisting of microelectronics conductor materials, microelectronics semiconductor materials and microelectronics dielectric materials. The substrate 10 may be the substrate itself employed in a microelectronics fabrication, or alternatively the substrate 10 may be any of several microelectronics material layers formed upon a substrate employed within a microelectronics fabrication.

With respect to the sensitive layer 12 shown in FIG. 1, the sensitive layer 12 may be chosen from the group of electron beam sensitive materials including but not limited to polybutene sulfone (PBS), chain scission positive tone solvent developable resist formulations (e.g., ZEP 7000, manufactured by Nippon Zeon Co., Ltd.), and medium-resolution positive resists (e.g., EBR 9HS31. Preferably, the sensitive resist layer is formed employing PBS resist obtained by Nippon Co., under the trade name ZEON, 2-6-1, Marunouchi, Chiyoda-ku, Tokyo 100-00t, Japan.

Referring now more particularly to FIG. 2, there is shown a schematic cross-sectional diagram illustrating the results of further processing of the substrate whose schematic cross-sectional diagram is shown in FIG. 1 in accord with the first preferred embodiment of the present invention. Shown in FIG. 2 is a substrate otherwise equivalent to the substrate shown in FIG. 1, but where there has been written in the resist layer 12' a pattern 14 by electron beam lithography employing focused beam 16a. Pattern 14 has been written with a beam dose corrected for proximity effects. A second "ghost" pattern 15 has been written by electron beam lithography employing a focused beam 16b such that pattern 15 is an inverted negative of pattern 14. A gap 17 has been left between patterns 14 and 15 in order to minimize sub-field boundary overlap and field stitching effects between the two patterns. Preferably the gap is about the width of several beam widths, and is about 2 to about 6 microns.

Referring now more particularly to FIG. 3, there is shown a schematic diagram showing a plan view of the first pattern 14 and second pattern 15 written in the resist layer 12' employing electron beam lithography patterning processes 16a and 16b respectively.

Referring now more particularly to FIG. 4, there is shown a schematic cross-sectional diagram illustrating the results of further processing of the substrate whose schematic cross-sectional diagram is shown in FIG. 2 in accord with the first preferred embodiment of the present invention. Shown in FIG. 4 is a substrate otherwise equivalent to the substrate shown in FIG. 2, but where there has been developed the pattern 14 in the exposed sensitive resist layer 12' to form the patterned sensitive resist layer 12", where the pattern 14 corresponds to an electron beam written image pattern corrected for proximity effects.

With respect to the developed patterned layer 12" shown in FIG. 4, the developed patterned layer 12" has been formed employing methods and materials as are known in the art of photolithography employed in microelectronics fabrication.

The first preferred embodiment of the present invention provides a method for forming upon a substrate a patterned resist layer employing electron beam lithography to write a first pattern wherein the electron energy dose is corrected for proximity effects, followed by writing a second inverted negative "ghost" pattern of the first pattern to complete the correction of the first pattern. A gap is left unexposed between the first pattern and the "ghost" pattern to minimize sub-field boundary and stitching effects.

Second Preferred Embodiment

Referring now more particularly to FIG. 5 to FIG. 8, FIG. 5 to FIG. 8 show a series of schematic cross-sectional diagrams illustrating the results of forming a patterned photomask employing electron beam lithography of an electron beam resist material with optimal correction for proximity effects due to electron back scattering into the resist layer. FIG. 5 is a schematic cross-sectional diagram of a photomask substrate at an early stage in its fabrication in accord with a more specific embodiment of the present invention which constituted a second preferred embodiment of the present invention. Shown in FIG. 5 is a photomask substrate 30 over which is formed an opaque layer 31 and a sensitive resist layer 32.

With respect to the photomask substrate 30 shown in FIG. 5, the photomask substrate 30 is analogous to the substrate 10 shown in FIG. 1 of the first embodiment of the present invention, and is formed of transparent material. Preferably the substrate 30 is formed of optically perfect fused quartz (silica)

With respect to the opaque layer 31 shown in FIG. 5, the opaque layer 31 is formed employing methods and materials as are known in the art of photomask fabrication. Preferably the opaque layer 31 is formed of chromium metal employing vacuum evaporation.

With respect to the sensitive layer 32 shown in FIG. 5, the sensitive layer 32 is analogous or equivalent to the sensitive layer 12 shown in FIG. 1 of the first preferred embodiment of the present invention.

Figure 6:
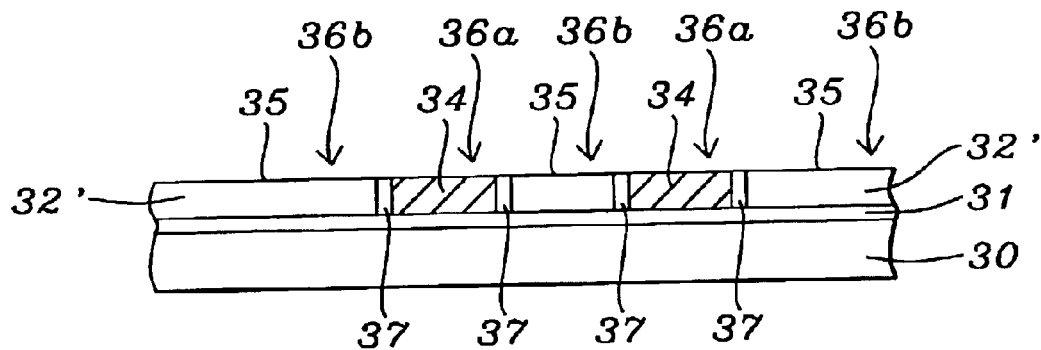

Referring now more particularly to FIG. 6, there is shown a schematic cross-sectional diagram illustrating the results of further processing of the photomask substrate whose schematic cross-sectional diagram is shown in FIG. 5 in accord with the second preferred embodiment of the present invention. Shown in FIG. 6 is a photomask substrate otherwise equivalent to the photomask substrate shown in FIG. 5, but where there has been written a first pattern 34 in the sensitive layer 32' employing beam lithography with an electron energy dose corrected for proximity effects 36a, followed by a second pattern 35 written in the sensitive layer 32' by electron beam lithography which is a "ghost" negative of the first pattern 34 and is written with a uniform electron dose equivalent to the maximum dose correction determined for first pattern 34.

With respect to the first pattern 34 and the second "ghost" pattern 35 written by electron beam lithography processes 36a and 36b respectively shown in FIG. 6, the patterns 34 and 35 and the electron beam processes 36a and 36b are analogous or equivalent to the patterns 14 and 15 and the electron beam lithography processes 16a and 16b shown in FIG. 1 of the first preferred embodiment of the present invention.

Figure 7:
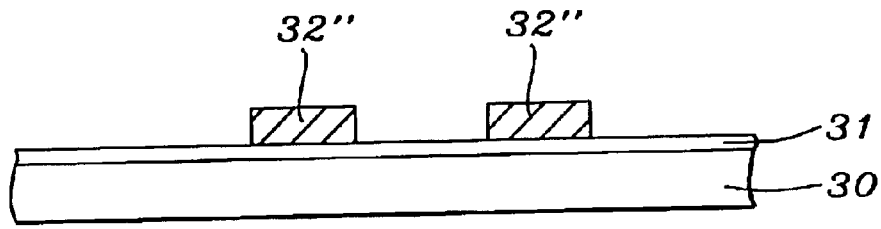

Referring now more particularly to FIG. 7, there is shown a schematic cross-sectional diagram illustrating the results of further processing of the photomask substrate whose schematic cross-sectional diagram shown in FIG. 6 in accord with the second preferred embodiment of the present invention. Shown in FIG. 7 is a photomask substrate otherwise equivalent to the photomask substrate shown in FIG. 6, but where there has been developed the first pattern 34 in the sensitive resist layer.

With respect to the development of the patterned image 32" of the corrected first pattern in the sensitive layer shown in FIG. 7, the patterned corrected image 32" is analogous to the patterned image 12" shown in FIG. 4 of the first preferred embodiment of the present invention.

Figure 8:
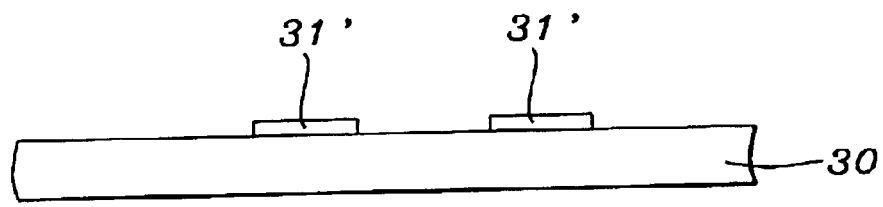

Referring now more particularly to FIG. 8, there is shown a schematic cross-sectional diagram illustrating the final results of the processing of the photomask substrate whose schematic cross-sectional diagram is shown in FIG. 7 in accord with the second preferred embodiment of the present invention. Shown in FIG. 8 is a photomask substrate otherwise equivalent to the photomask substrate shown in FIG. 7, but where there has been subtractively etched the pattern of the patterned resist layer 35' into the opaque layer 31 to form the patterned opaque layer 31' on the transparent substrate 30, followed by stripping of the resist layer 32" to complete the photomask.

With respect to the etching of the opaque layer 31 and stripping of the patterned resist layer 35 to form the completed opaque layer pattern 31' on the transparent substrate shown in FIG. 8, the etching and stripping are performed employing methods and materials as are known in the art of photolithography as employed in microelectronics fabrication.

The preferred second embodiment of the present invention provides a method for forming a patterned opaque layer on a transparent photomask substrate, employing electron beam lithography to write a pattern in a sensitive resist layer on the photomask substrate corrected for proximity effects. Subsequent development and etching of the corrected pattern is employed to produce a photomask for photolithography.

The photomask produced employing the second preferred embodiment of the present invention may be a binary photomask, or alternately there may be employed other fabrication methods and materials in conjunction with those of the present invention to produce more complex photomasks such as, for example, a phase shift mask (PSM).

Experimental

Figure 9:
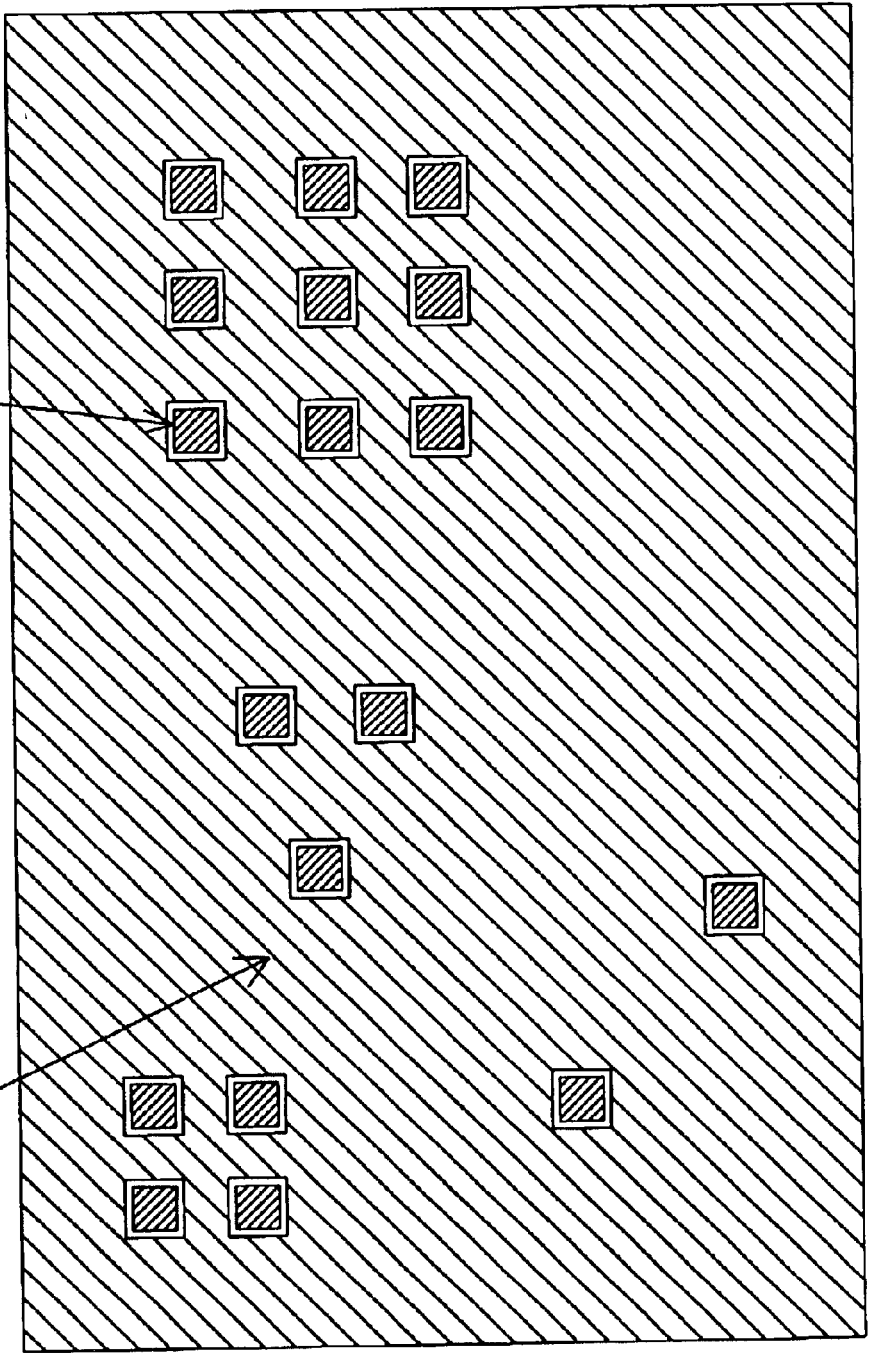
FIG. 9 and FIG. 10 are schematic illustrations of patterns having sparsely populated and densely populated features such as contact holes (FIG. 9) and line-space patterns (FIG. 10).
Figure 10:
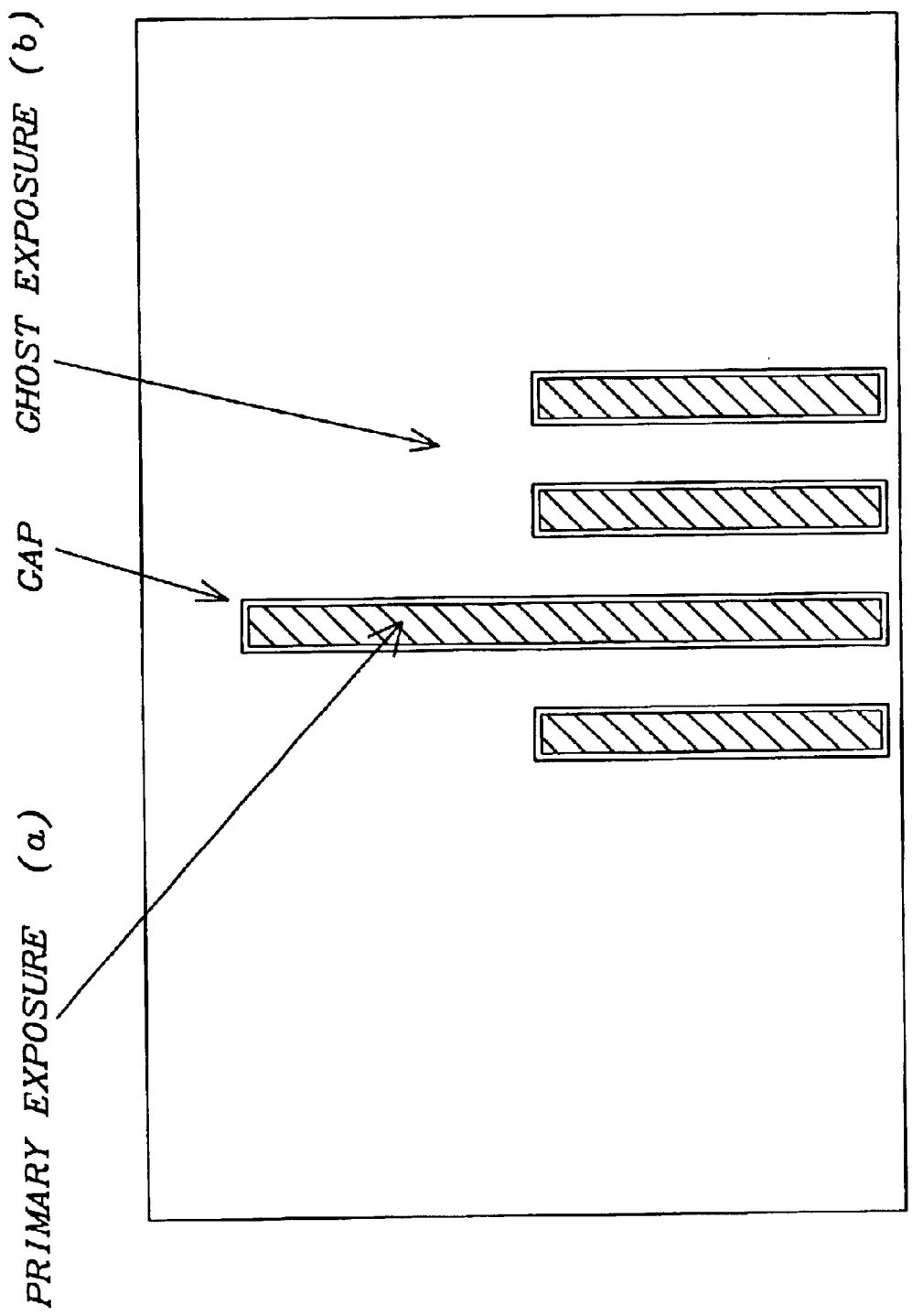

The benefits of the present invention are exemplified by the experimental results obtained employing the methods of the present invention. A series of patterns were written and developed on three different sensitive resist layer materials employing MEBES 4500 electron beam lithography system obtained from ETEC System, Inc. 26460 Corporate Avenue, Mail Drop B/44F2, Hayward, Calif., USA, with both dose adjustment and "ghost" pattern methods for proximity effect correction, and subsequent measurements of pattern dimensions were performed employing scanning electron microscopy (SEM). The patterns employed were a series of lines and spaces (FIG. 9) and contact holes (FIG. 10) as well as isolated line and contact features, and the conditions for the three resist materials examined are given in Table I:

TABLE I

Comparison of "Ghost" Correction Effects for Three Resist Materials MEBES 4500 System (10 Kev); Cr on quartz

|  | ZEP 7000 | PBS | EBR9HS31 |
| --- | --- | --- | --- |
| Thickness, A | 3000 | 2500 | 4000 |
| Dose uC/cm$^2$ | 8 | 2 | 4 |
| Address size, nm | 50 | 50 | 50 |
| Beam size, nm | 120 | 80 | 80 |
| Defocused beam size, Ghost, nm | 700 | 700 | 700 |
| Correction/primary dose ratio, Qc/Qp | 0.30 | 0.40 | 0.37 |
| Etching condition | dry | wet | wet |

Figure 11:
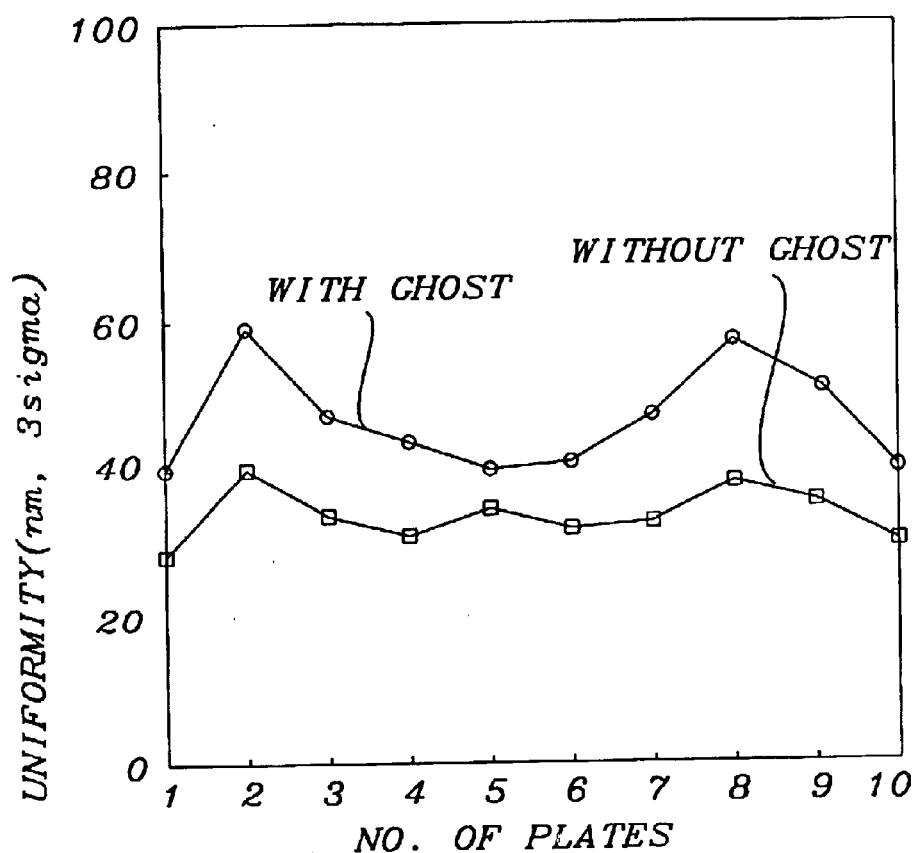
FIG. 11 and FIG. 12 are graphs of the linearity of critical dimensions in patterns formed in electron beam sensitive resist materials.
Figure 12:
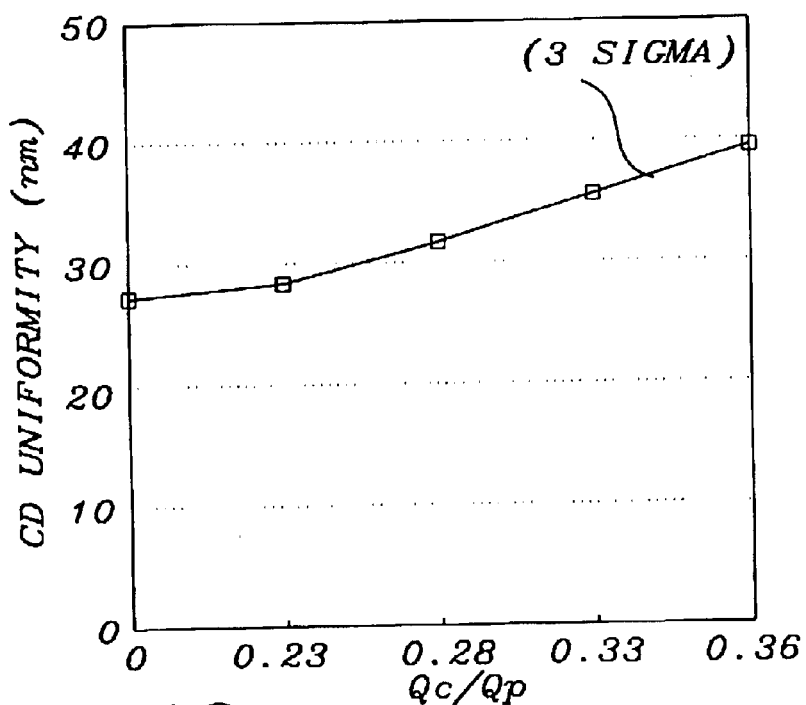

The results for patterns formed employing the conditions in Table I for "ghost" correction alone are summarized in FIG. 11 and FIG. 12. FIG. 11 shows the results obtained for uniformity in terms of three standard deviations for line widths in patterns formed in PBS resist which are typical of all three resist materials. It is seen that "ghost" correction alone is not as accurate as writing the pattern with a primary dose for this experiment. In FIG. 12, the results for uniformity of line widths in terms of three standard variations is shown for ZEP 7000 resist as a function of the ratio Qc/Qp of the correction dose Qc employed for the "ghost" pattern to the primary dose Qp. As this ratio increases, the deviation or non-uniformity becomes larger.

When the primary pattern is written with a system which allows dose correction such as the Hitachi system (obtained from Hitachi Co., 1-24-14 Nishi-Shimbashi Minato-ku, Tokyo 1058717, Japan), combining a "ghost" pattern with dose correction provides an improvement as shown in Table II:

TABLE II

Comparison of "Ghost" Correction Alone, Dose Correction Alone and Combined Dose plus "Ghost" Correction for Pattern Formation by Electron Beam Lithography

|  | Ghost correction | Dose correction | Dose + ghost correction |
| --- | --- | --- | --- |
| Proximity correction | "ghost" | dose correction | dose + "ghost" |
| Electron Beam | MEBES raster | Hitachi vector | Hitachi vector |
| Beam Shape | Gaussian | shaped beam | shaped beam |
| Beam voltage, KeV | 10 | 50 | 50 |
| Ghost beam focus | defocused | focused | focused |
| Reverse (negative) | yes | no | yes (gap) |
| Uniformity | poor | good | good |
| Isolated/dense proximity effect | poor for 1/s < 0.5 u | fair | good |
| Dimension linearity | fair (>0.5 u) | poor < 0.72 u | good |
| Throughput | poor | good | poor |

It is readily seen that the third column, which represents the present invention, provides improved results in terms of improved pattern formation and accuracy.

As is understood by a person skilled in the art, the preferred embodiment of the present invention is illustrative of rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for electron beam lithography comprising:
providing a substrate having formed thereupon a layer of material sensitive to electron beam exposure;
writing a primary pattern employing an electron beam exposure of the sensitive layer;
writing a secondary or "ghost" pattern employing electron beam exposure of the sensitive layer, which "ghost" pattern is a negative of the primary pattern, while providing a gap at the border of separation between primary and secondary patterns.

2. The method of claim 1 wherein the primary pattern is written with a vector scan electron beam where the dose for each pattern element is corrected for proximity effects.

3. The method of claim 1 wherein the secondary or "ghost" pattern is written with a vector scan shaped focused electron beam at a dose which is substantially equivalent to the maximum dose absorbed by the resist in the primary pattern.

4. The method of claim 1 wherein the gap at the border separating the periphery of the primary pattern from the secondary or "ghost" pattern is from about 2 to about 6 microns.

5. The method of claim 1 wherein the substrate is formed from material selected from the group consisting of: microelectronics conductor materials; microelectronics semiconductor materials; and microelectronics dielectric materials.

6. A method for forming a patterned photomask employing electron beam lithography of an electron beam sensitive resist layer on a photomask substrate comprising:
providing a transparent substrate having formed thereupon an opaque layer over which is formed an electron beam sensitive resist layer;
exposing the substrate to an vector scan electron beam in a primary pattern where there has been corrected the electron beam dose for mutual proximity and self proximity effects;
exposing the substrate to an electron beam employing a vector scan shaped focused beam in a secondary pattern which is the inverted negative of the primary pattern, where there is provided a gap between the borders of the primary pattern and the secondary pattern;
developing the exposed resist pattern and etching the opaque layer to form the photomask with corrected pattern.

7. The method of claim 6 wherein the transparent substrate is a fused quartz substrate.

8. The method of claim 6 wherein the opaque layer is formed of chromium.

9. The method of claim 6 wherein the gap at the border between the primary and secondary pattern is from about 2 to about 6 microns.

10. The method of claim 6 wherein the photomask is fabricated so as to provide a binary photomask.

11. The method of claim 6 wherein the photomask is further fabricated to provide a phase shift mask (PSM).

12. A method for electron beam lithography comprising:
providing a substrate having formed thereupon a layer of material sensitive to electron beam exposure;
writing a primary pattern employing an electron beam exposure of the sensitive layer;
writing a secondary or "ghost" pattern employing electron beam exposure of the sensitive layer, which "ghost" pattern is a negative of the primary pattern, while providing a gap at the border of separation between primary and secondary patterns; and
developing the layer of material sensitive to electron beam exposure, leaving the primary pattern corresponding to an electron beam written image pattern corrected for proximity effects.

* * * * *